United States Patent [19]

Sakamoto et al.

[11] Patent Number: 4,623,831
[45] Date of Patent: Nov. 18, 1986

[54] ROTOR POSITION SENSING APPARATUS FOR MOTORS

[75] Inventors: Keiji Sakamoto; Yukio Toyozawa, both of Hachioji, Japan

[73] Assignee: Fanuc Ltd, Minamitsuru, Japan

[21] Appl. No.: 650,721

[22] PCT Filed: Oct. 26, 1983

[86] PCT No.: PCT/JP83/00380
§ 371 Date: Sep. 28, 1984
§ 102(e) Date: Sep. 28, 1984

[87] PCT Pub. No.: WO84/01821
PCT Pub. Date: May 10, 1984

[30] Foreign Application Priority Data

Oct. 26, 1982 [JP] Japan ............... 57-187939

[51] Int. Cl.$^4$ ............. H02P 5/40; G08C 19/28
[52] U.S. Cl. ................. 318/799; 340/347 P
[58] Field of Search .......... 318/640, 313, 799; 250/570; 340/347 P; 324/175

[56] References Cited

U.S. PATENT DOCUMENTS

| 3,824,587 | 7/1974 | Fowler | 340/347 P |
| 4,090,116 | 5/1978 | Lippitt | 318/345 E |
| 4,194,184 | 3/1980 | Hartmann et al. | 340/347 P |
| 4,356,544 | 10/1982 | Ono et al. | 318/811 |
| 4,361,794 | 11/1982 | Kawada et al. | 318/811 |
| 4,458,192 | 7/1984 | Sakamoto et al. | 318/803 |

OTHER PUBLICATIONS

Le-Huy et al., "Microprocessor Control of a Current-Fed Synchronous Motor Drive", Conference; Industry Applications Society, IEEE-IAS Annual Meeting, Cleveland, Ohio, USA, (Sept. 30–Oct. 4, 1979), pp. 873–880.

Primary Examiner—David Smith, Jr.
Attorney, Agent, or Firm—Staas & Halsey

[57] ABSTRACT

A pulse encoder (2) is provided for generating a position code IP corresponding to the rotational position of a rotor of a motor (1), as well as rotation pulses AP, BP each of which is produced whenever the rotor rotates by a predetermined amount. The rotation pulses AP, BP are applied to a counter (32) via quadrupling pulse generating circuit (30). A leading edge/trailing edge sensing circuit (31) is provided for sensing a transition point of the position code, with the counter (32) being preset by an output from the circuit (32). Thus, the position of the rotor is capable of being indicated precisely based on the position code and the value counted by the counter.

9 Claims, 9 Drawing Figures

ROTOR POSITION SENSING APPARATUS FOR MOTORS

BACKGROUND OF THE INVENTION

1. Technical Field

This invention relates to a rotor position sensing apparatus for motors for sensing the rotational position of a motor such as a synchronous motor. More particularly, the invention relates to a rotor position sensing apparatus for motors wherein a fine position code is capable of being generated by performing an interpolation between position codes from a sensor provided on a rotor.

2. Description of the Related Art

A rotating field-type synchronous motor, which is composed of an armature serving as a stator and a field pole serving as a rotor, is operable to generate a rotating field by application of a three-phase current to the stator windings (armature windings), with the field pole being pulled by the rotating field so as to rotate at the same velocity as the rotating field.

Though a synchronous motor of this kind has been considered to involve complicated velocity control and control circuitry of a complex construction in comparison with a DC motor, a drive method has recently been developed for effecting torque generation control in a manner equivalent to that of a DC motor, thereby facilitating velocity control of the synchronous motor.

According to this drive method, torque generation is controlled in a manner equivalent to that of a DC motor if the armature current and induced voltage are controlled to have the same phase (i.e., if control is effected in such a manner that the main flux and armature current are rendered mutually perpendicular). To realize such control, it is necessary to sense the position of the field pole (i.e., the phase of the main flux, which is displaced from the phase of the induced voltage by 90°), generate a current command having a phase corresponding to the position, and apply the current command to the armature windings of the synchronous motor.

In general, in order to sense the position of the field pole, a widely adopted arrangement has a pulse coder provided on the rotary shaft of the field pole (rotor). The pulse coder produces a position code corresponding to the rotational position of the rotor and thus allows the rotational position of the rotor to be sensed. The pulse coder is composed of a rotary disk having position codes disposed radially of the the position codes. However, the number of position codes capable of being disposed along the circumference of the coder is limited by resolution, with the number being several hundred at most even if a high-resolution Gray code is used as the position code. The position sensing precision is therefore less than satisfactory, making it difficult to carry out fine control.

Accordingly, an object of the present invention is to provide a rotor position sensing apparatus for motors which, irrespective of a limitation imposed on a number of position codes by the resolution of a sensor for sensing the rotational position of a rotor, readily enables generation of fine position signals surpassing the number of position codes of the sensor.

SUMMARY OF THE INVENTION

According to the present invention, a sensor generates a coarse position code which corresponds to the rotational position of a rotor of a motor, as well as fine rotation pulses each of which is issued whenever the rotor rotates through a predetermined angle. The rotation pulses are counted by a counter. The rotational position of the rotor is indicated by the coarse position code and the value counted by the counter. According to the invention, a precise rotor position is capable of being indicated even when the position code is coarse, thereby enabling a motor to be controlled in accurate fashion.

DESCRIPTION OF THE PREFERRED EMBODIMENT

The present invention will now be described in detail with reference to the drawings.

Figure 1:
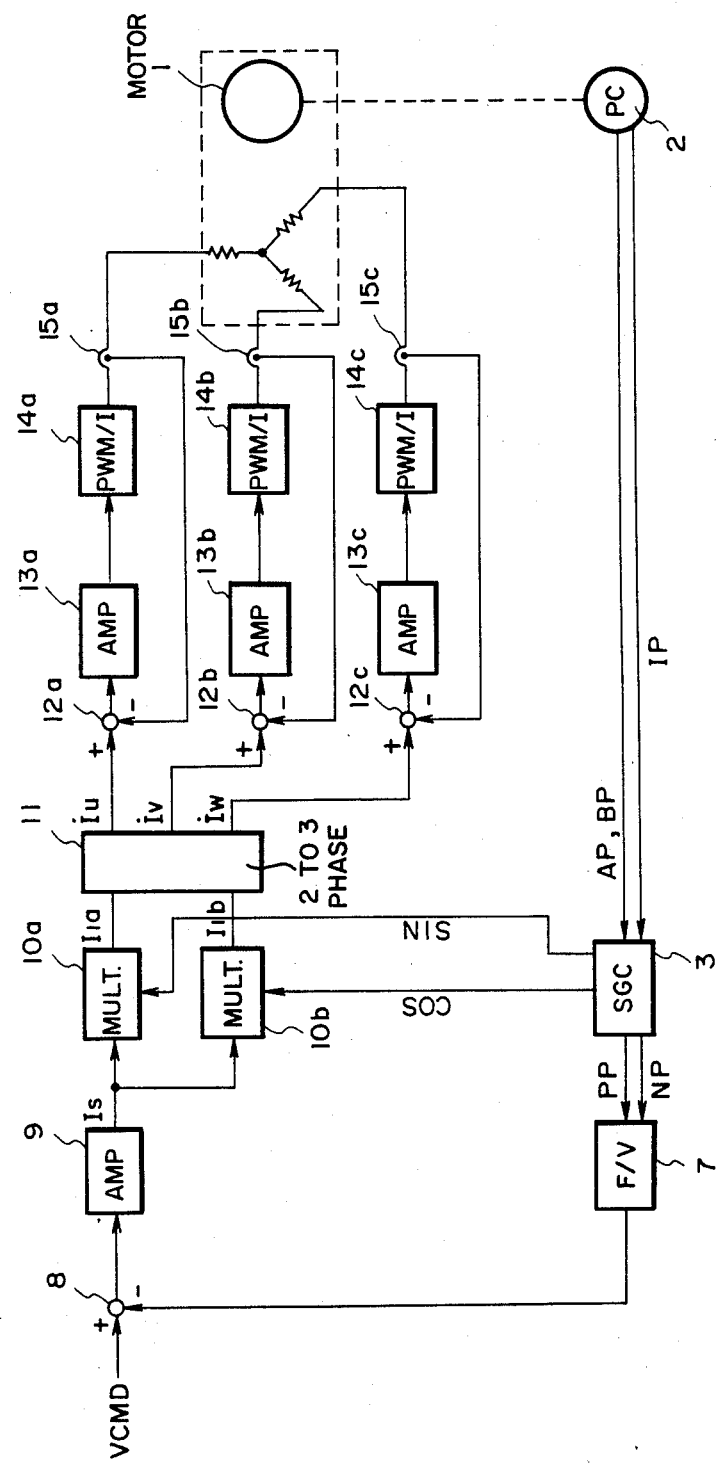
FIG. 1 is a block diagram, of an embodiment of the present invention.

FIG. 1 is a block diagram showing an embodiment of a synchronous motor control system utilizing the present invention.

In the Figure, numeral 1 denotes a revolving field-type synchronous motor, and numeral 2 designates a pulse encoder coupled directly to the shaft of the synchronous motor 1 for generating a variety of position signals.

Figure 2:
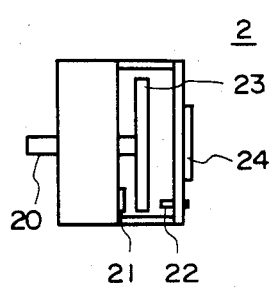
FIGS. 2 and 3 are views illustrating the construction of a pulse encoder shown in the arrangement of FIG. 1.

The pulse encoder 2 will now be described in detail with reference to FIGS. 2 and 3. The pulse encoder 2 includes a code disk 23 provided on a rotary shaft 20 which is directly connected to the shaft of the synchronous motor 1, a light-emitting element 22 such as a light-emitting diode for reading a position signal from the code disk 23, a light-receiving element 21 such as a photodiode, the elements 21, 22 being disposed so as to face each other with the code disk 23 interposed therebetween, and an output circuit 24.

Figure 3:
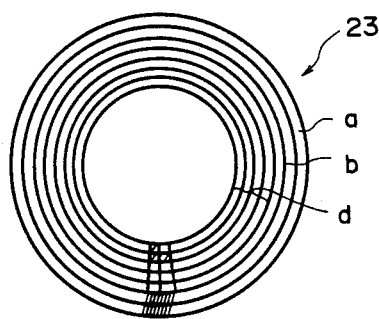

As shown in FIG. 3, an A-phase track a, a B-phase track b, and a code track d comprising four tracks are formed concentrically on the code disk 23. Patterns are formed on the A- and B-phase tracks a, b in such a manner that rotation pulse trains (incremental pulses) displaced in phase from each other by $\pi/2$ will be generated when the code disk rotates.

The code track d comprises four tracks each of which is formed with a pattern in such a manner that different four-bit position codes (absolute codes) will be generated in correspondence with each angle of rotation of the code disk. A Gray code is used for the position codes.

Numeral 3 denotes a sine wave generating circuit, described below. The circuit 3 includes a counter which is set by a position code IP from the pulse encoder 2, and which counts A-phase pulses AP and B-phase pulses BP from the pulse encoder 2 to produce values of $\sin\theta$, $\cos\theta$, which are dependent upon the counted value.

Numeral 7 denotes an F/V converter for converting the pulse rate of a positive pulse train PP or negative pulse train NP from the sine wave generating circuit 3 into a voltage, the output voltage being an actual velocity voltage TSA, which is proportional to the rotational velocity of the synchronous motor 1.

Numeral 8 denotes an arithmetic circuit for calculating the difference (hereafter referred to as a velocity error) ER between the actual velocity voltage TSA and a velocity command VCMD issued by a velocity command circuit, not shown. Numeral 9 designates an error amplifier for amplifying the velocity error ER to produce the amplitude $I_s$ of an armature current. Numerals 10a, 10b represent multiplier circuits for multiplying the output of the error amplifier 9 by the outputs $\cos\theta$, $\sin\theta$ of the sine wave generating circuit 3 to produce two-phase current commands $\dot{I}_1a$ ($=I_s\cdot\sin\theta$), $\dot{I}_1b$ ($=I_s\cdot\cos\theta$), respectively.

Figure 4:
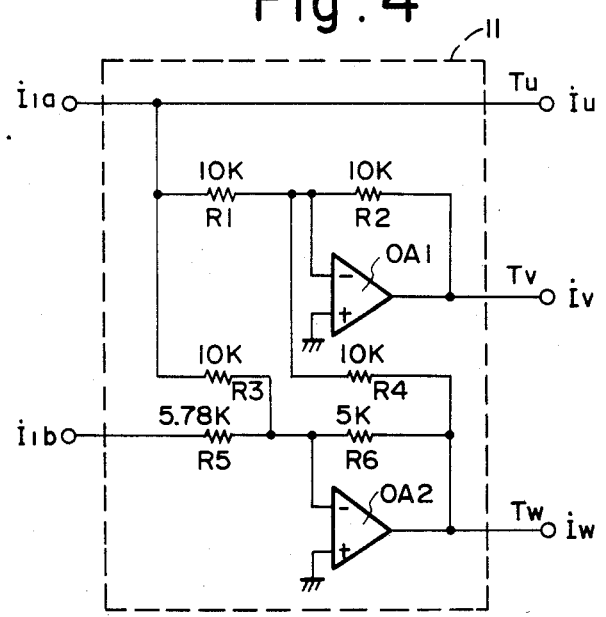
FIG. 4 is a view showing the construction of a two phase-three phase converting circuit in the arrangement of FIG. 1.

Numeral 11 denotes a two phase-three phase converting circuit having the circuit construction shown in FIG. 4 for converting the two-phase signal into a three-phase signal. More specifically, the two phase-three phase converting circuit 11 includes two operational amplifiers $OA_1$, $OA_2$, 10 KΩ resistors $R_1$ through $R_4$, a 5.78 KΩ resistor $R_5$, and a 5 KΩ resistor $R_6$. With these values for the resistors $R_1$ through $R_6$, and with the connections as illustrated, the following are produced at the terminals $T_u$, $T_v$, $T_w$:

$$\dot{I}_u = \dot{I}_1a \qquad (1)$$

$$\dot{I}_v = \frac{-1}{2}\dot{I}_1a + \frac{\sqrt{3}}{2}\dot{I}_1b$$

$$\dot{I}_w = \frac{-1}{2}\dot{I}_1a - \frac{\sqrt{3}}{2}\dot{I}_1b$$

These signals $\dot{I}_u$, $\dot{I}_v$, $\dot{I}_w$ are three-phase current commands displaced in phase from one another by $2\pi/3$ and of the same phase as the phases of the induced voltage $E_o$.

Numerals 12, 12b, 12c denote arithmetic circuits for obtaining the differences between the commanded currents $\dot{I}_u$, $\dot{I}_v$, $\dot{I}_w$ and the actual phase currents. More specifically, these calculate the differences between the current commands $\dot{I}_u$, $\dot{I}_v$, $\dot{I}_w$ in the respective phases, and actual phase currents $I_{au}$, $I_{av}$, $I_{aw}$ sensed by current transformers 15a, 15b, 15c, respectively. Numerals 13a, 13b 13c denote current amplifiers provided in the respective phases for amplifying the current differences in these phases.

Figure 5:
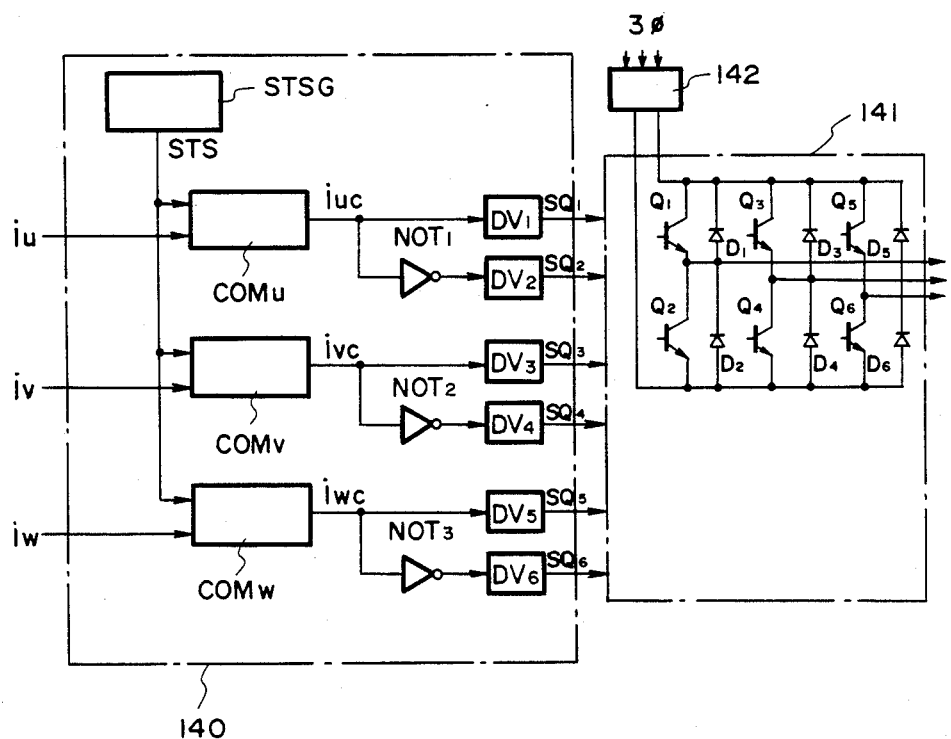
FIG. 5 is a view showing the construction of a pulse-width modulator-inverter circuit in the arrangement of FIG. 1.

Numerals 14a, 14b, 14c designate pulse-width modulator/inverter circuits. As illustrated in FIG. 5, the pulse width modulator/inverter circuits 14a, 14b, 14c each include a sawtooth generating circuit STSG for generating a triangular wave, e.g., a sawtooth signal STS, comparators $COM_u$, $COM_v$, $COM_w$, NOT gates $NOT_1$ through $NOT_3$, and drivers $DV_1$ through $DV_6$. These components construct a pulse-width modulator circuit 140. The inverter 141 includes six power transistors $Q_1$ through $Q_6$ and six diodes $D_1$ through $D_6$.

Figure 6:
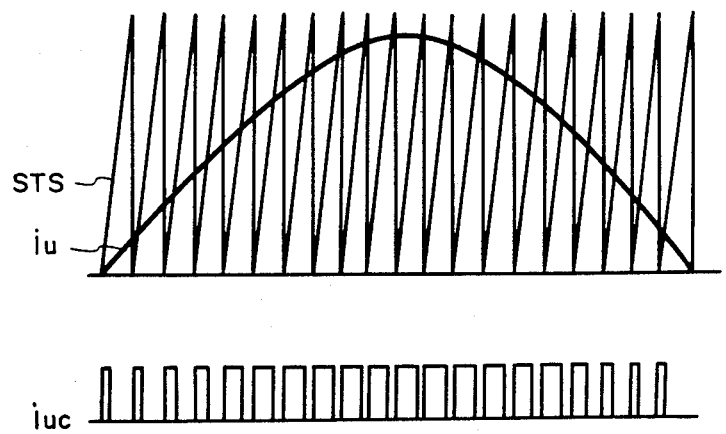
FIG. 6 is a waveform diagram for a pulse-width modulation operation performed in FIG. 5.

The comparators $COM_u$, $COM_v$, $COM_w$ compare the sawtooth signal STS with the amplitudes of the three-phase alternating current signals $i_u$, $i_v$, $i_w$, respectively, and produce a "1" output when $i_u$, $i_v$ or $i_w$ is greater than the value of STS, or a "0" output when $i_u$, $i_v$ or $i_w$ is smaller. Thus, with respect to $i_u$, the comparator $COM_u$ produces the pulse-width modulated current command $i_{uc}$ shown in FIG. 6. More specifically, pulse-width modulated three-phase current commands $i_{uc}$, $i_{vc}$, $i_{wc}$ dependent upon the amplitudes of $i_u$, $i_v$, $i_w$ are produced.

It should be noted that a triangular signal in the form of isosceles triangles can be employed instead of the sawtooth signal used for pulse-width modulation. There is no limitation upon the kind of sawtooth signal or isosceles-type triangular signal; various triangular signals can be used providing that pulse-width modulation is carried out satisfactorily.

The NOT gates $NOT_1$ through $NOT_3$ and drivers $DV_1$ through $DV_6$ convert the current commands $i_{uc}$, $i_{vc}$, $i_{wc}$ into drive signals $SQ_1$ through $SQ_6$ to control the on/off action of the power transistors $Q_1$ through $Q_6$ constituting the inverter 141. Numeral 142 denotes a rectifying circuit for DC current feed, and numerals 15a, 15b, 15c designate current transformers for sensing the actual phase currents.

Described next will be the operation of the motor control system in FIG. 1 which includes the rotor position sensing apparatus of the present invention.

When the power supply is turned on, the position code IP from the pulse encoder 2 enters the sine wave generating circuit 3, which converts the code into corresponding values of $\cos\theta$, $\sin\theta$ and produces output voltages conforming to $\cos\theta$, $\sin\theta$. Thereafter, the velocity command VCMD is applied to the synchronous motor 1, which is supplied with three-phase alternating current. When the synchronous motor 1 rotates, the pulse encoder 2 generates the A-phase pulses AP and the B-phase pulses BP, in an order which depends upon the direction of rotation. These pulses are counted by the counter. Thus, a sine wave $\sin\theta$ and a cosine wave $\cos\theta$ conforming to both the position code IP and position $\theta$ of the rotor are produced.

Meanwhile, to rotate the synchronous motor 1 at a desired rotational velocity $V_c$, an addition input terminal of the arithmetic circuit 8 is supplied with a velocity command VCMD having a predetermined analog value. Since the synchronous motor 1 is rotating at an actual velocity $V_a$ ($<V_c$), the F/V converter 7 produces the actual velocity voltage TSA, which is proportional to the actual velocity $V_a$. The actual velocity voltage TSA is applied to a subtraction terminal of the arithmetic circuit 8. Accordingly, the arithmetic circuit 8 calculates the velocity error ER, which is the difference between the commanded velocity $V_c$ and the actual velocity $V_a$, and applies the error to the error amplifier 9. The error amplifier 9 performs a proportional integration operation expressed by the following equation:

$$\left.\begin{array}{l}I_s = K_1(V_c - V_a) + K_2\Sigma(V_c - V_a)\\ \Sigma(V_c - V_a) = \Sigma(V_c - V_a) + (V_c - V_a)\end{array}\right\} \qquad (2)$$

The result $I_s$ in Eq. (2) corresponds to the amplitude of the armature current. Specifically, when the load varies or the velocity command changes, the velocity error ER ($=V_c-V_a$) becomes greater, as does the armature current amplitude $I_s$ correspondingly. The increased amplitude $I_s$ results in the production of a greater torque, which brings the actual rotational velocity of the motor into conformity with the commanded velocity.

Since the sine wave generating circuit 3 produces the two-phase sine and cosine waves $\cos\theta$, $\sin\theta$ indicating the position 8 of the field pole of synchronous motor 1, the multiplier circuits 10a, 10b perform the computations given by:

$I_1a = I_s \cdot \sin\theta$, $I_1b = I_s \cdot \cos\theta$ to produce two-phase current command $I_1a$, $I_1b$. The two phase-three phase converting circuit 11 then performs the computation indicated by Eq. (1) to produce three-phase current commands $I_u$, $I_v$, $I_w$. These are three-phase current commands the phases of which are the same as those of the induced voltage $E_o$ of the synchronous motor 1.

Thereafter, the arithmetic circuits 12a, 12b, 12c compute the differences between the three-phase current commands $\dot{I}_u$, $\dot{I}_v$, $\dot{I}_w$ and the actual phase currents $I_{au}$, $I_{av}$, $I_{aw}$. These differences, namely the three-phase AC signals $i_u$, $i_v$, $i_w$, are amplified and then applied to the respective comparators $COM_U$, $COM_V$, $COM_W$ of the pulse-width modulator/inverter circuits 14a, 14b, 14c. The comparators $COM_U$, $COM_V$, $COM_W$ compare the sawtooth signal STS with the amplitudes of the three-phase AC signals $i_u$, $i_v$, $i_w$ and produce the pulse-width modulated three-phase current commands $i_{uc}$, $i_{vc}$, $i_{wc}$, whereby the inverter drive signals $SQ_1$ through $SQ_6$ are produced via the NOT gates $NOT_1$ through $NOT_3$ and drivers $DV_1$ through $DV_6$. The inverter drive signals $SQ_1$ through $SQ_6$ are applied to the bases of the respective power transistors $Q_1$ through $Q_6$ constituting the inverter 141, thereby controlling the on/off action of the power transistors $Q_1$ through $Q_6$ to supply the synchronous motor 1 with three-phase current. Control is thenceforth performed in a similar manner until the synchronous motor 1 eventually rotates at the commanded velocity.

The construction and operation of the sine wave generating circuit including the rotor position sensing apparatus of the present invention will now be described.

Figure 7:
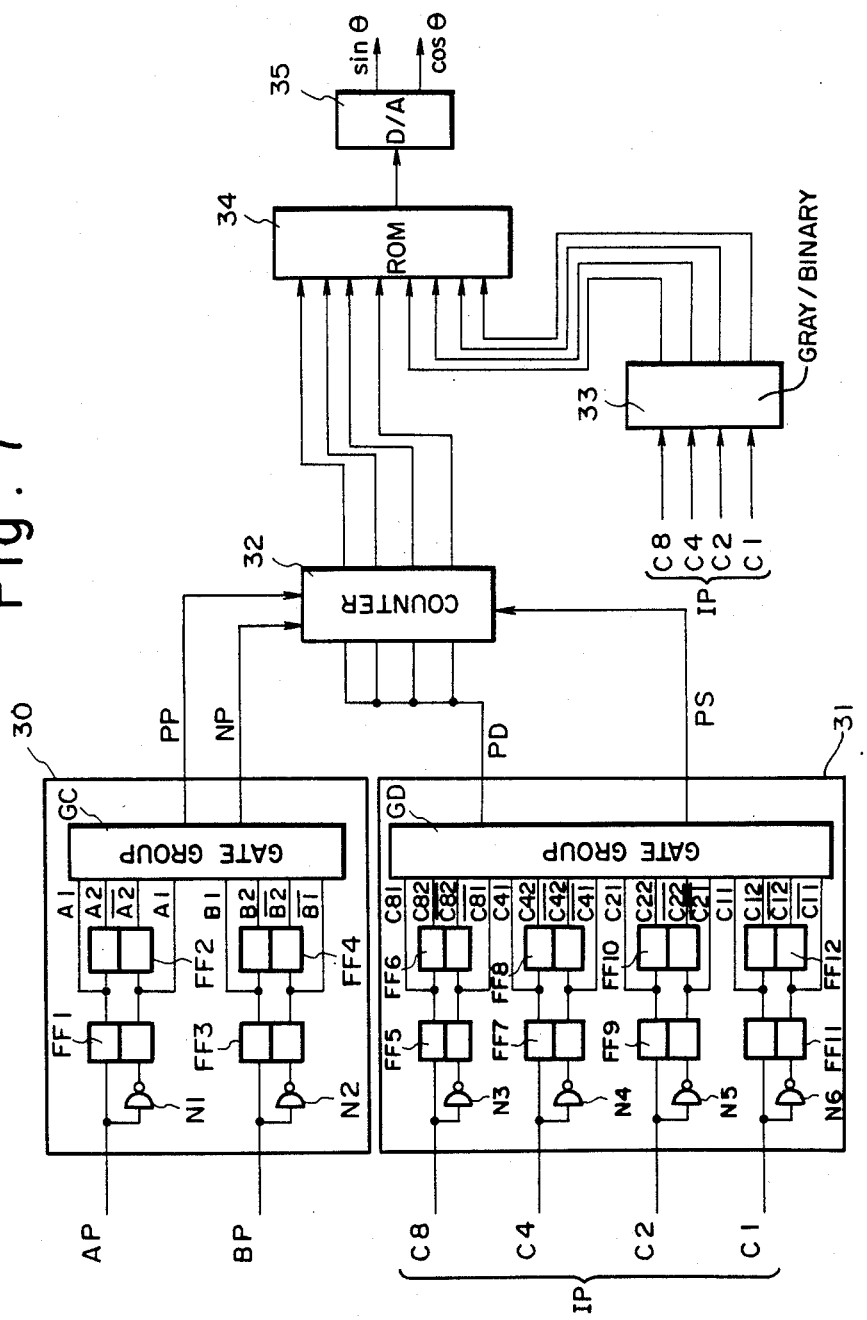
FIG. 7 is a detailed block diagram of a rotor position sensing apparatus according to the present invention.

FIG. 7 is a block diagram of an embodiment of the present invention. In the Figure, numeral 30 denotes a quadrupling pulse generating circuit. Using the A- and B-phase rotation pulses AP, BP, the quadrupling pulse generating circuit 30 generates quadrupled positive rotation pulses PP when rotation is in the forward direction, and quadrupled negative rotation pulses NP when rotation is in the reverse direction. Numeral 31 denotes a leading edge/trailing edge sensing circuit for sensing the leading edge/trailing edge of each bit of bits $C_1$ through $C_8$ of the position code IP, and for producing preset data PD and a preset signal PS for a counter, described below. Numeral 32 denotes an up/down counter which is set to the preset data PD in response to the preset signal PS from the leading edge/trailing edge sensing circuit 31, and which counts up the positive rotation pulses PP and counts down the negative rotation pulses NP. Numeral 33 denotes a Gray/binary conversion circuit for converting the Gray code of the position code IP (bits $C_1$ through $C_8$) into a binary code. Numeral 34 denotes a read-only memory (ROM) which stores the digital values $\sin\theta$, $\cos\theta$ of the sine and cosine waves at respective addresses. With the binary position code from the Gray/binary conversion circuit 33 serving as the upper order digit of an address and the counted value from the counter 32 serving as the lower order digit of the address, the corresponding values of $\sin\theta$, $\cos\theta$ may be read out of the ROM. Numeral 35 denotes a digital/analog (D/A) converter for converting the values of $\sin\theta$, $\cos\theta$ from the ROM 34 into analog outputs which are delivered to the multiplier circuits 10a, 10b (FIG. 1), respectively.

Figure 8:
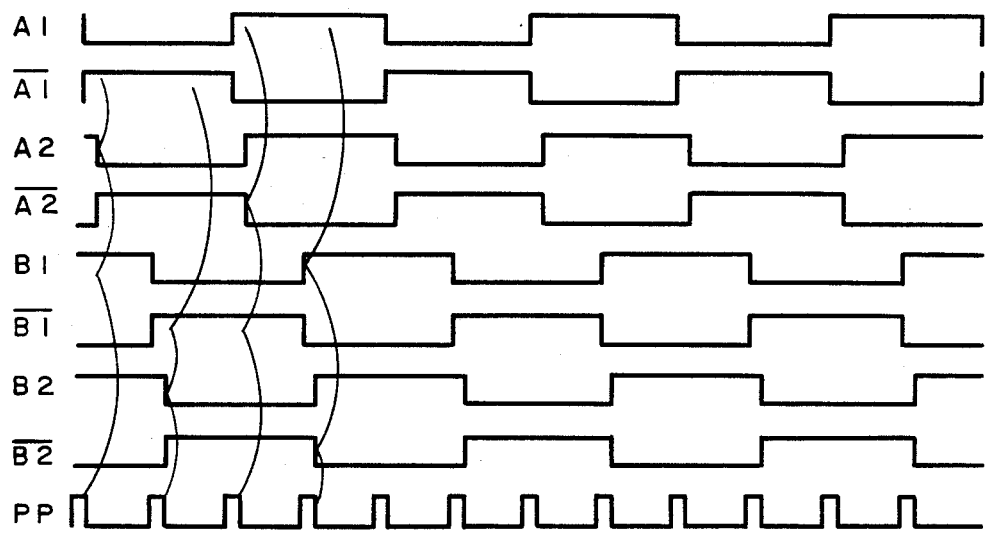
FIG. 8 is a waveform diagram of the operation of principal portions of FIG. 7.

The quadrupling pulse generating circuit 30 is provided with a NOT circuit $N_1$ and flip-flop circuits $FF_1$, $FF_2$ for the A-phase pulses AP, and with a NOT circuit $N_2$ and flip-flop circuits $FF_3$, $FF_4$ for the B-phase pulses BP. Also provided is a gate group circuit GC for forming the positive rotation pulses PP or reverse rotation pulses from the outputs of the flip-flops $FF_1$ through $FF_4$. This circuit will now be described with reference to the waveform diagram of FIG. 8.

If the motor is rotating in the forward direction, the B-phase pulses BP are generated at a 90° phase lag with respect to the A-phase pulses AP. If the motor is rotating in the reverse direction, the A-phase pulses AP are generated at a 90° phase lag with respect to the B-phase pulses BP. Accordingly, as shown by the waveform diagram for forward rotation in FIG. 8, the Q, $\overline{Q}$ outputs of the flip-flop circuit $FF_1$ have the form $A_1$, $\overline{A}_1$ shown in the Figure, so that an output is generated in phase with, or opposite in phase to, the A-phase pulses AP. These outputs $A_1$, $\overline{A}_1$ are delayed by one block by means of the flip-flop circuit $FF_2$, emerging as outputs $A_2$, $\overline{A}_2$. The same is true for the B-phase pulses BP, with the flip-flop circuits $FF_3$, $FF_4$ cooperating to generate outputs $B_1$, $\overline{B}_1$, $B_2$, $\overline{B}_2$. These eight outputs $A_1$, $\overline{A}_1$, $A_2$, $\overline{A}_2$, $B_1$, $\overline{B}_1$, $B_2$, $\overline{B}_2$ are applied to the gate group circuit GC, which forms the positive rotation pulses PP or negative rotation pulses NP. Specifically, since the positive rotation pulses PP are formed under the conditions $(\overline{AHD}\ 1 \cdot A_2 \cdot B_1)$, $(\overline{AHD}\ 1 \cdot \overline{BHD}\ 1 \cdot B_2)$, $(A_1 \cdot \overline{A}_2 \cdot \overline{B}_1)$, $(A_1 \cdot B_1 \cdot \overline{B}_2)$, four AND gates are provided for detecting these conditions, and an OR gate is provided for taking the logical sum of the outputs from the AND gates, with the output of the OR gate being the positive rotation pulses PP shown in FIG. 8. These are pulses having four times the pulse rate of the A-phase pulses AP or B-phase pulses BP.

If the motor is rotating in the reverse direction, the phase relationship between the outputs $A_1$ through $\overline{A}_2$ based on the A-phase pulses and the outputs $B_1$ through $\overline{B}_2$ based on the B-phase pulses is reversed, so that the negative rotation pulses NP are formed under the conditions $(\overline{B}_1 \cdot B_2 \cdot A_1)$, $(\overline{B}_1 \cdot \overline{AHD}\ 1 \cdot A_2)$, $(B_1 \cdot \overline{B}_2 \cdot A_1)$, $(B_1 \cdot A_1 \cdot \overline{A}_2)$. Four AND gates are provided for detecting these conditions, and an OR gate is provided for taking the logical sum of the outputs from the AND gates, with the output of the OR gate being the negative rotation pulses NP. These are pulses having four times the pulse rate of the A-and B-phase pulses AP, BP. Accordingly, the gate group circuit GC produces solely the positive rotation pulses PP when rotation is in the forward direction, and solely the negative rotation pulses NP when rotation is in the reverse direction.

The aforementioned leading edge/trailing edge sensing circuit 31 is provided with NOT circuits $N_3$, $N_4$, $N_5$, $N_6$, prestage flip-flop circuits $FF_5$, $FF_7$, $FF_9$, $FF_{11}$ and poststage flip-flop circuits $FF_6$, $FF_8$, $FF_{10}$, $FF_{12}$ for the bits $C_1$, $C_2$, $C_4$, $C_8$ of the position code IP. Thus, four outputs are produced with respect to each of the bits $C_1$, $C_2$, $C_4$, $C_8$ of the position code IP, namely $C_{81}$, $\overline{C}_{81}$, $C_{82}$, $\overline{C}_{82}$, $C_{41}$, $\overline{C}_{41}$, $C_{42}$, $\overline{C}_{42}$, $C_{21}$, $\overline{C}_{21}$, $C_{22}$, $\overline{C}_{22}$, $C_{11}$, $\overline{C}_{11}$, $C_{12}$, $\overline{C}_{12}$. The phase relationship among these four outputs is the same as that for the outputs $A_1$ through $A_2$ based on the A-phase pulses AP of FIG. 8.

These 16 outputs $C_{81}$ through $\overline{C}_{12}$ are applied to the gate group circuit GD, which forms the preset data PD and preset signal PS. The gate group circuit GD senses the transition points of the position code IP (i.e., the leading edge/trailing edge thereof). Specifically, since the four outputs $C_{81}$ through $\overline{C}_{82}$, $C_{41}$ through $\overline{C}_{42}$, $C_{21}$ through $\overline{C}_{22}$ or $C_{11}$ through $\overline{C}HD\,12$ will have the same phase relationship as the outputs $A_1$ through $\overline{A}_2$ of FIG. 8, as mentioned above, the trailing edge of each bit is capable of being sensed by the conditions $(\overline{C}_{81} \cdot C_{82})$, $(\overline{C}_{41} \cdot C_{42})$, $(\overline{C}_{21} \cdot C_{22})$, $(\overline{C}_{11} \cdot C_{12})$, so that it will suffice if four AND gates are provided for detecting these conditions. Further, the leading edge of each bit is capable of being sensed by the conditions $(C_{81} \cdot \overline{C}_{82})$, $(C_{41} \cdot \overline{C}_{42})$, $(C_{21} \cdot \overline{C}_{22})$, $(C_{11} \cdot \overline{C}_{12})$, so that it will suffice if four AND gates are provided for detecting these conditions. The logical sum of the outputs from these eight AND gates is taken by an OR gate, the output of which is delivered as the preset signal PS which thus indicates a transition in the position code.

The gate group circuit GD also has a circuit for sensing the direction of motor rotation from the aforementioned 16 inputs $C_{81}$ through $\overline{C}_{12}$, and for producing preset data "0000" as an output in case of forward rotation, and preset data "1111" as an output in case of reverse rotation. Here a change in the Gray code is utilized. Specifically, the Gray code is arranged as shown in the following table:

TABLE

| No. | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| C8 | 0 | 0 | 0 | 0 | 0 | 0 | 0 | 1 | 1 | 1 | 1 | 1 | 1 | 1 | 1 | 1 |
| C4 | 0 | 0 | 0 | 0 | 1 | 1 | 1 | 1 | 1 | 1 | 1 | 0 | 0 | 0 | 0 | 0 |
| C2 | 0 | 0 | 1 | 1 | 1 | 1 | 0 | 0 | 0 | 1 | 1 | 1 | 1 | 0 | 0 | 0 |
| C1 | 0 | 1 | 1 | 0 | 0 | 1 | 1 | 0 | 0 | 1 | 1 | 0 | 0 | 1 | 1 | 0 |

Accordingly, if we let forward rotation correspond to the direction in which "No." increases and reverse rotation correspond to the direction in which "No." decreases, then a change in forward rotation from "0000" to "0001" can be sensed by the condition $(\overline{C}_{82} \cdot \overline{C}_{42} \cdot \overline{C}_{22} \cdot \overline{C}_{12} \times C_{11} \cdot \overline{C}_{12})$ since this will be a case where the current position code IP is "0000" and a leading edge occurs at bit $C_1$. Similarly, a change in forward rotation from "0001" to "0011) can be sensed by the condition $(\overline{C}_{82} \cdot \overline{C}_{42} \cdot \overline{C}_{22} \cdot C_{12} \times C_{21} \cdot \overline{C}_{22})$ since this will be a case where the current position code is "0001" and a leading edge occurs at bit $C_2$. Thereafter, and in similar fashion, 16 conditions are established, whereby it becomes possible to sense forward rotation and produce forward rotation pulses. Accordingly, 16 AND gates are provided for detecting each of these conditions, an OR gate is provided for taking the logical sum of the outputs from these AND gates, and a circuit is provided for generating preset data PD of "0000" in response to the output (forward rotation pulses) of the OR gate. This allows forward rotation to be sensed and the preset data "0000" to be produced as an output. Conversely, in case of reverse rotation, an change from "0001" to "0000" can be sensed by the condition $(\overline{C}_{82} \cdot \overline{C}_{42} \cdot \overline{C}_{22} \cdot C_{12} \times \overline{C}_{11} \cdot C_{12})$ since this will be a case where the current position code is "0001" and a trailing edge occurs at bit $C_1$. As described above with regard to forward rotation, 16 conditions are established, and it will suffice to provide 16 AND gates corresponding to these conditions, one OR gate and a circuit for generating "1111" as the preset data PD.

Though a change in the Gray code is utilized in the foregoing description, a change in a binary code can be employed and results obtained in a similar manner in a case where the position code is a binary code.

The operation of the arrangement shown in FIG. 7 will now be described. First, for forward rotation of the motor, the quadrupling pulse generating circuit 30 generates the positive rotation pulses PP by utilizing the above-described A- and B-phase pulses AP, BP. The counter 32 counts up the positive rotation pulses. Meanwhile, the position code IP is applied to the leading edge/trailing edge sensing circuit 31, which senses the transition points (leading edge/trailing edge) and generates the preset signal PS. A forward rotation pulse is produced whenever a transition point occurs, and "0000" is generated as the preset data PD. The counter 32 is preset to the preset data PD "0000" whenever a transition point is sensed, and thereafter counts up the positive rotation pulses PP until the next transition point is sensed (i.e., until the preset signal PS is generated). The position code IP is converted into a binary position code IP by the Gray/binary conversion circuit 33 and is applied to the ROM 34 as the higher order digit of the address thereof. The value counted by the counter 32 is applied to the ROM 34 as the lower order digit of the address.

Figure 9:
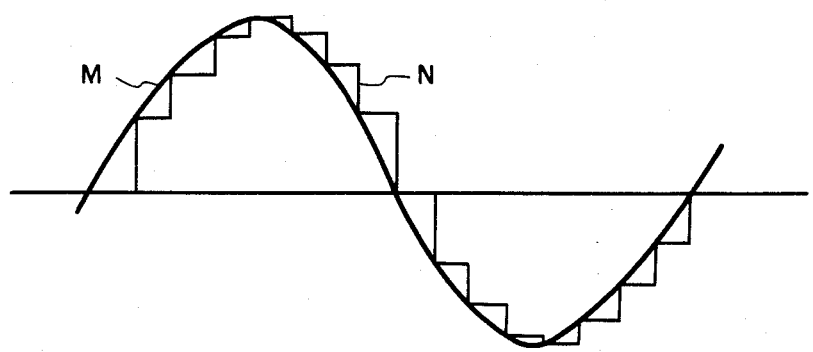
FIG. 9 is a waveform diagram for a sine wave generating operation according to the present invention.

In response to the combination of the address digits, the values digits, the values $\sin\theta$, $\cos\theta$ at the corresponding address of the ROM 34 are read from the ROM. Accordingly, the number of addresses applied to the ROM 34 is $2^n$ times the number that would prevail in the case of the position code IP alone (where n is the number of bits possessed by the counter 32). This makes it possible to generate addresses of a correspondingly fine precesion. The values of $\sin\theta$, $\cos\theta$ are converted into analog values of $\sin\theta$, $\cos\theta$ by the DA converter 35. Accordingly, as shown in FIG. 9 which is a view for describing the operation of the circuitry, the analog value of $\sin\theta$ or of $\cos\theta$ is delivered as an output M having a smooth, sinusoidal waveform, rather than as an output N which has a step-like waveform when the solely the position code IP is used.

If the motor is rotating in the reverse direction, the quadrupling pulse generating circuit 30 generates the negative rotation pulses NP, and the leading edge/trailing edge sensing circuit 31 generates "1111" as the preset data PD whenever the preset signal PS is generated. The counter 32 is preset to the preset data PD "1111" whenever the preset signal PS is generated, and thereafter counts down the negative rotation pulses NP until the next preset signal PS is generated. The ROM 34 is then addressed in the manner described above with regard to forward rotation, and therefore the description of reverse rotation will not be given.

According to the present invention as described above, a counter is provided for counting fine rotation pulses from a sensor, and the rotational position of a rotor is indicated by a rough position code from the sensor and the value counted by the counter. The invention is advantageous in that a fine rotor position can be indicated even when the position code is coarse. In particular, though the number of actual position codes is limited by resolution, the present invention, which makes it possible to produce a number of position codes several score that of the number of actual position codes, is extremely useful for precise control of a motor.

Since the foregoing can be achieved purely through circuitry without modification of the conventional sensor, the apparatus is simple in construction and control can be performed with facility.

Though the present invention has been described in conjunction with an embodiment thereof, the invention is not limited to the aforesaid embodiment and various modifications can be made in accordance with the gist of the invention without departing from the scope thereof.

According to the present invention, the arrangement is such that a fine position code can be generated by performing an interpolation between position codes from a sensor provided on the rotor of a motor, thereby making it possible to provide a precise indication of the position of the motor rotor. As a result, the motor can be controlled in a precise manner. The present invention is therefore well-suited for application to the field of motor control.

We claim

1. A rotor position sensing apparatus for a rotor in a motor, said apparatus producing a digital position signal corresponding to a rotational position of the rotor, said apparatus comprising:
   position code means for supplying a position code corresponding to the rotational position of the rotor;
   rotation pulse means for supplying a rotation pulse whenever said rotor rotates by a predetermined amount;
   a counter for counting the rotation pulse to produce a value; and
   position indicating means for supplying the digital position signal with high order bits based on the position code and lower order bits based on the value counted by said counter.

2. A rotor position sensing apparatus according to claim 1, further comprising transition point sensing means for sensing a transition point of the position code to generate a transition signal, said counter being preset by the transition signal.

3. A rotor position sensing apparatus according to claim 1, wherein said rotation pulse generating means comprises a quadrupling pulse generating circuit for generating a quadrupled number of rotation pulses.

4. A rotor position sensing apparatus according to claim 1, further comprising a pulse encoder provided on a rotary shaft of said rotor for generating the position code and the rotation pulse.

5. A rotor position sensing apparatus according to claim 2, wherein the rotor has a rotation direction and the transition signal produced by said transition point sensing means includes preset data indicating the rotation direction of the rotor.

6. A rotor position sensing apparatus for a rotor in a motor, said apparatus producing a position signal corresponding to a rotational position of the rotor, said apparatus comprising:
   position code means for supplying a position code corresponding to the rotational position of the rotor;
   rotation pulse means for supplying a rotation pulse whenever said rotor rotates by a predetermined amount;
   transition point sensing means for sensing a transition point of the position code to generate a transition signal including preset data indicating the rotation direction of the rotor;
   a counter for counting the rotation pulse to produce a value, said counter being preset by the preset data in the transition signal; and
   position indicating means for indicating the rotational position of the rotor based on the position code and on the value counted by said counter, said position indicating means comprising memory means for storing a sinusoidal wave in a table having an address, said memory means utilizing the position code to determine high order bits of the address and the value counted by the counter to determine low order bits of the address.

7. A rotor position sensing apparatus according to claim 6, wherein the position code is encoded using Gray code and said memory means comprises:
   code conversion means for converting the position code from Gray code to binary code; and
   a read only memory, operatively connected to said code conversion means and said counter for receiving the binary code as a high order bits address portion and the value counted by the counter as a low order bits address portion.

8. A method for sensing a rotor position of a rotor in a motor, comprising the steps of:
   (a) storing motor energization data corresponding to precise rotor positions in a table;
   (b) generating a position code corresponding to the rotor position of the rotor;
   (c) generating rotation pulses when the rotor rotates by a predetermined amount;
   (d) counting the rotation pulses; and
   (e) accessing the table utilizing an address having high order bits defined by the position code and low order bits defined by the value counter in step (d).

9. A rotor position sensing apparatus for a rotor in a motor, said apparatus producing a position signal corresponding to a rotational position of the rotor, said apparatus comprising:
   position code means for supplying a position code corresponding to the rotational position of the rotor;
   rotation pulse means for supplying a rotation pulse whenever said rotor rotates by a predetermined amount;
   a counter for counting the rotation pulse to produce a value; and
   memory means for storing sinusoidal wave data in a table having addresses, said memory means supplying one of the sinuisoidal wave data stored at a corresponding address by utilizing the position code to determine high order bits of the corresponding address and the value counted by the counter to determine low order bits of the corresponding address.

* * * * *

UNITED STATES PATENT AND TRADEMARK OFFICE
CERTIFICATE OF CORRECTION

PATENT NO. : 4,623,831
DATED : November 18, 1986
INVENTOR(S) : Sakamoto et al.

It is certified that error appears in the above-identified patent and that said Letters Patent is hereby corrected as shown below:

Column 1, line 49, after "the" (first occurrence) insert --disk at predetermined angles, and a sensor for reading--.
Column 3, line 46, "12" should be --12a--.
Column 5, line 6, "8" should be --$\theta$--.
Column 6, line 24, "$A_1$" (second occurrence) should be --$\bar{A}_1$--;

line 36, "($\bar{A}$HD 1" (both occurrences) should be --($\bar{A}_1$--;

line 36, "$\bar{B}$HD 1" should be --$\bar{B}_1$--;

line 49, "$\bar{A}$HD 1" should be --$\bar{A}_1$--.

Column 7, line 1, "$A_2$" should be --$\bar{A}_2$--;

line 9, "$\bar{C}$HD 12" should be --$\bar{C}_{12}$--.

Column 8, line 30, "digits, the values" should be --of--.
Column 9, line 36, "lower" should be --low--.

Signed and Sealed this

Thirty-first Day of March, 1987

*Attest:*

DONALD J. QUIGG

*Attesting Officer*     *Commissioner of Patents and Trademarks*